US009558985B2

(12) United States Patent
    Wang et al.

(10) Patent No.: US 9,558,985 B2
(45) Date of Patent: Jan. 31, 2017

(54) VACUUM CHUCK

(75) Inventors: Jian Wang, Shanghai (CN); Yinuo Jin, Shanghai (CN); Yong Shao, Shanghai (CN); Hui Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 222 days.

(21) Appl. No.: 14/389,192

(22) PCT Filed: Mar. 28, 2012

(86) PCT No.: PCT/CN2012/073175
    § 371 (c)(1),
    (2), (4) Date: Sep. 29, 2014

(87) PCT Pub. No.: WO2013/143081
    PCT Pub. Date: Oct. 3, 2013

(65) Prior Publication Data
    US 2015/0069723 A1    Mar. 12, 2015

(51) Int. Cl.
    *B23B 31/30* (2006.01)
    *H01L 21/683* (2006.01)
    *B25B 11/00* (2006.01)

(52) U.S. Cl.
    CPC ......... *H01L 21/6838* (2013.01); *B23B 31/307* (2013.01); *B25B 11/005* (2013.01); *H01L 2221/683* (2013.01); *Y10T 279/11* (2015.01)

(58) Field of Classification Search
    CPC .. B23B 31/307; B25B 11/005; H01L 21/6838; H01L 2221/683; Y10T 279/11
    See application file for complete search history.

(56) References Cited

U.S. PATENT DOCUMENTS 2,691,937 A * 10/1954 Emerson ............... B28B 11/001
                                                    101/407.1
2,852,264 A *  9/1958 Granata ................ B23B 31/307
                                                    279/3

(Continued)

FOREIGN PATENT DOCUMENTS

CN       101496158 A     7/2009
CN       102034732 A     4/2011
WO     2008/072877 A1    6/2008

OTHER PUBLICATIONS

Office Action issued in Chinese Application No. 201280071561.X; Dated May 4, 2016 (5 pages).

(Continued)

*Primary Examiner* — Eric A Gates
(74) *Attorney, Agent, or Firm* — Osha Liang LLP

(57) ABSTRACT

A vacuum chuck is disclosed for holding and positioning wafers more stably and securely. The vacuum chuck includes a supporting assembly having a receiving groove and at least one first vacuum aperture defined in the receiving groove. A seal unit includes a seal ring bulging to form a vacuum trough. The seal ring is fixed in the receiving groove of the supporting assembly and has at least one second vacuum aperture communicating with the first vacuum aperture. A chuck connector fastened with the supporting assembly has at least one vacuum port and at least one vacuum orifice communicating with the vacuum port. At least one vacuum hose connects the first vacuum aperture, the second vacuum aperture with the vacuum orifice and the vacuum port of the chuck connector for evacuating the air of the vacuum trough to hold and position the wafer on the seal ring and the supporting assembly.

19 Claims, 15 Drawing Sheets

(56) References Cited

U.S. PATENT DOCUMENTS

| | | | |
|---|---|---|---|
| 5,238,499 A * | 8/1993 | van de Ven | C23C 16/04 |
| | | | 118/724 |
| 6,032,997 A | 3/2000 | Elliott et al. | |
| 6,164,633 A | 12/2000 | Mulligan et al. | |
| 6,271,676 B1 | 8/2001 | Montoya | |
| 6,464,790 B1 | 10/2002 | Sherstinsky et al. | |
| 6,640,155 B2 * | 10/2003 | Saldana | B24B 37/20 |
| | | | 257/E21.23 |
| 6,652,357 B1 * | 11/2003 | Williams | B24B 41/04 |
| | | | 257/E21.23 |
| 7,368,016 B2 * | 5/2008 | Katsuoka | C23C 2/003 |
| | | | 118/313 |
| 2008/0087214 A1 | 4/2008 | Lee et al. | |
| 2011/0073776 A1 | 3/2011 | Inoue | |

OTHER PUBLICATIONS

International Search Report issued in PCT/CN2012/073175 mailed on Jan. 3, 2013 (3 pages).

* cited by examiner

VACUUM CHUCK

CROSS REFERENCE TO RELATED APPLICATIONS

This is a national stage application of PCT/CN2012/073175, filed on Mar. 28, 2012. This application claims the benefit and priority of this prior application and incorporates the disclosure of this prior application by reference in its entirety.

BACKGROUND OF THE INVENTION

1. Field of the Invention

The present invention generally relates to a chuck for holding and positioning semiconductor workpieces during various processing procedures, and more particularly relates to a vacuum chuck for holding and positioning the semiconductor workpieces more stably and securely.

2. The Related Art

In a semiconductor device manufacturing process, semiconductor workpieces such as wafers need to undergo various processing procedures. The wafers are usually held and positioned on a chuck to be processed and the chuck is an important device in the semiconductor device manufacturing process.

With the development of semiconductor technology, the chuck is improved gradually for satisfying the requirement of the various processing procedures. The chucks are divided into two kinds. One kind is a contact type chuck and the other kind is a non-contact type chuck. A vacuum chuck which holds and positions the wafer thereon by vacuum drawing force is a typical contact type chuck. Referring to U.S. Pat. No. 6,032,997 discloses a vacuum chuck. The vacuum chuck has a body portion. The body portion defines a top surface. A plurality of concentric flat lands are disposed on the top surface. Between every two adjoining lands, a concentric trench is defined. Several orifices are defined to pass through the body portion and communicate with the trenches respectively. Each orifice is connected to a vacuum hose which is connected to a vacuum source. The wafer contacts the lands and then the air is evacuated from the trenches. Lastly, the wafer is held on the lands of the vacuum chuck by the vacuum drawing force.

Another vacuum chuck is published in U.S. Pat. No. 6,164,633. The vacuum chuck has a generally square body. The body has a first surface and a second opposing surface. The first surface has a first circular platform and a second circular platform for receiving two different diameter wafers. The second surface has a third circular platform for receiving a wafer having a third diameter. A first vacuum trough and a second vacuum trough are respectively formed in the first platform and the second platform. A third vacuum trough is formed in the third platform. Three vacuum passageways are formed and extend from the interior portions of the body to three exterior vacuum ports located at one side of the body. Each vacuum passageway corresponds to a single vacuum trough and links the respective vacuum trough to a vacuum source and so that the air is evacuated from the vacuum trough to hold the wafer on the corresponding platform.

However, the two vacuum chucks disclosed above have very weak airtightness, which easily causes the wafer held thereon to come off the vacuum chuck and damage the wafer.

SUMMARY OF THE INVENTION

Accordingly, an object of the present invention is to provide a vacuum chuck for holding and positioning wafers more stably and securely. In an exemplary embodiment, the vacuum chuck includes a supporting assembly having a first receiving groove and a second receiving groove. At least one first vacuum aperture is defined in the first receiving groove. The supporting assembly has a vacuum passageway encircled by the second receiving groove. A first seal unit and a second seal unit are respectively fixed in the first receiving groove and the second receiving groove of the supporting assembly. The first seal unit includes a first seal ring bulging to form a vacuum trough. The first seal ring is fixed in the first receiving groove and has at least one second vacuum aperture communicating with the first vacuum aperture. The second seal unit includes a second seal ring fixed in the second receiving groove. A chuck connector fastened with the supporting assembly has at least one vacuum port and at least one vacuum orifice communicating with the vacuum port. The chuck connector has a vacuum passageway communicating with the vacuum passageway of the supporting assembly for evacuating the air enclosed by the second seal ring and the wafer. At least one vacuum hose connects the first vacuum aperture, the second vacuum aperture with the vacuum orifice and the vacuum port of the chuck connector for evacuating the air of the vacuum trough to hold and position the wafer on the seal rings and the supporting assembly.

BRIEF DESCRIPTION OF THE DRAWINGS

The present invention will be apparent to those skilled in the art by reading the following description of a preferred embodiment thereof, with reference to the attached drawings, in which.

DETAILED DESCRIPTION OF THE PREFERRED EMBODIMENT

Figure 1:
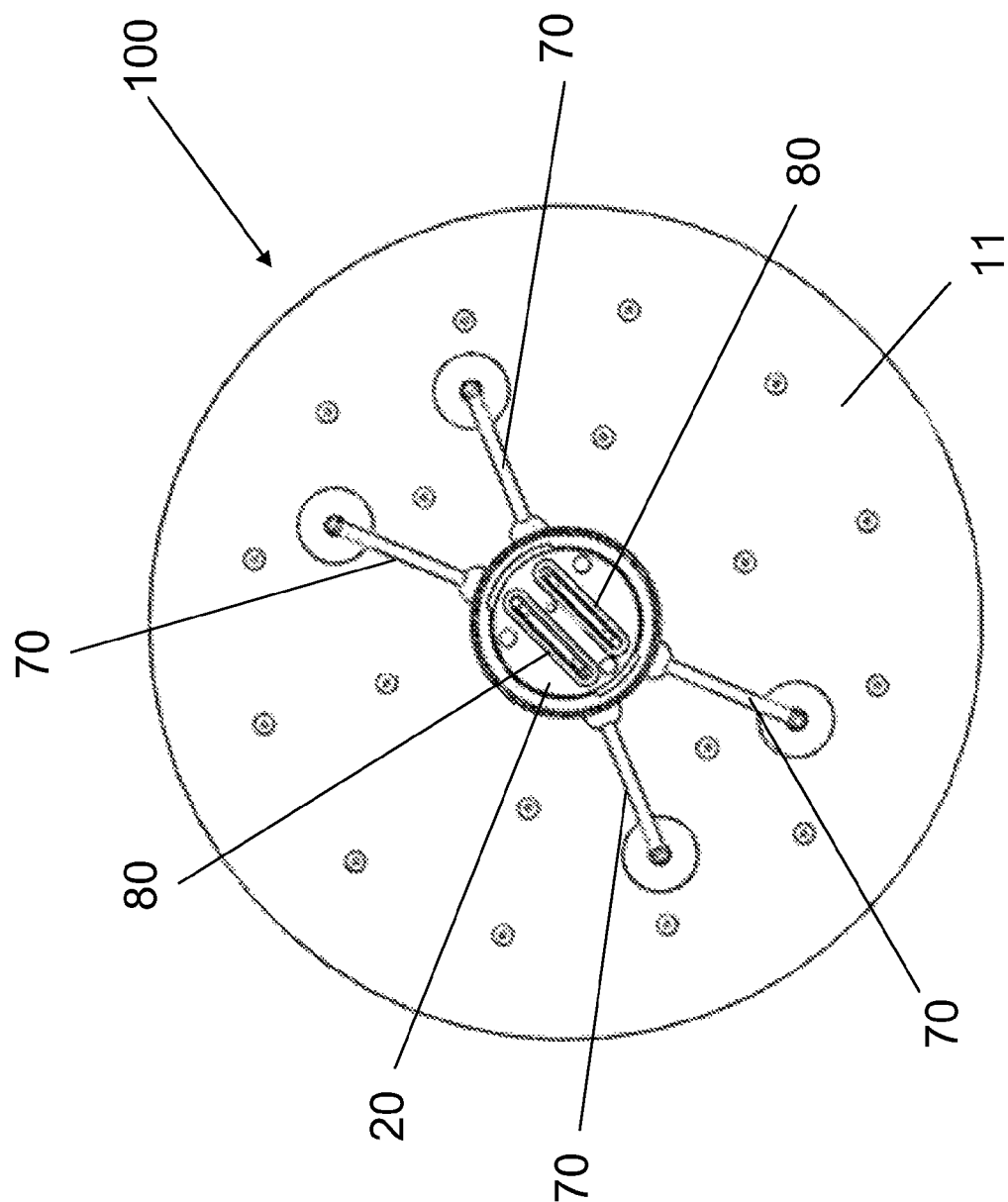
FIG. 1 is a top view of a vacuum chuck in accordance with the present invention.
Figure 2:
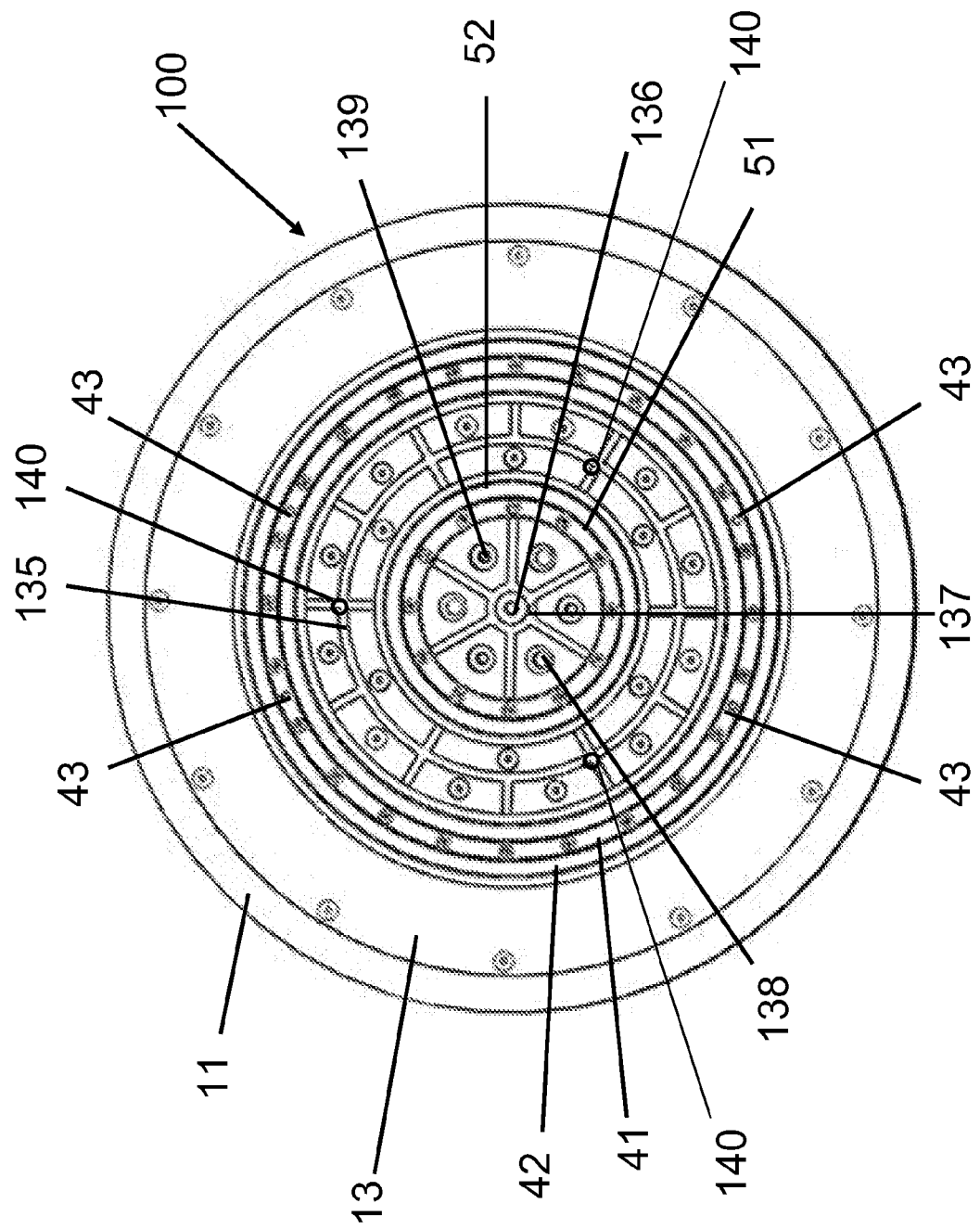
FIG. 2 is a bottom view of the vacuum chuck.
Figure 3:
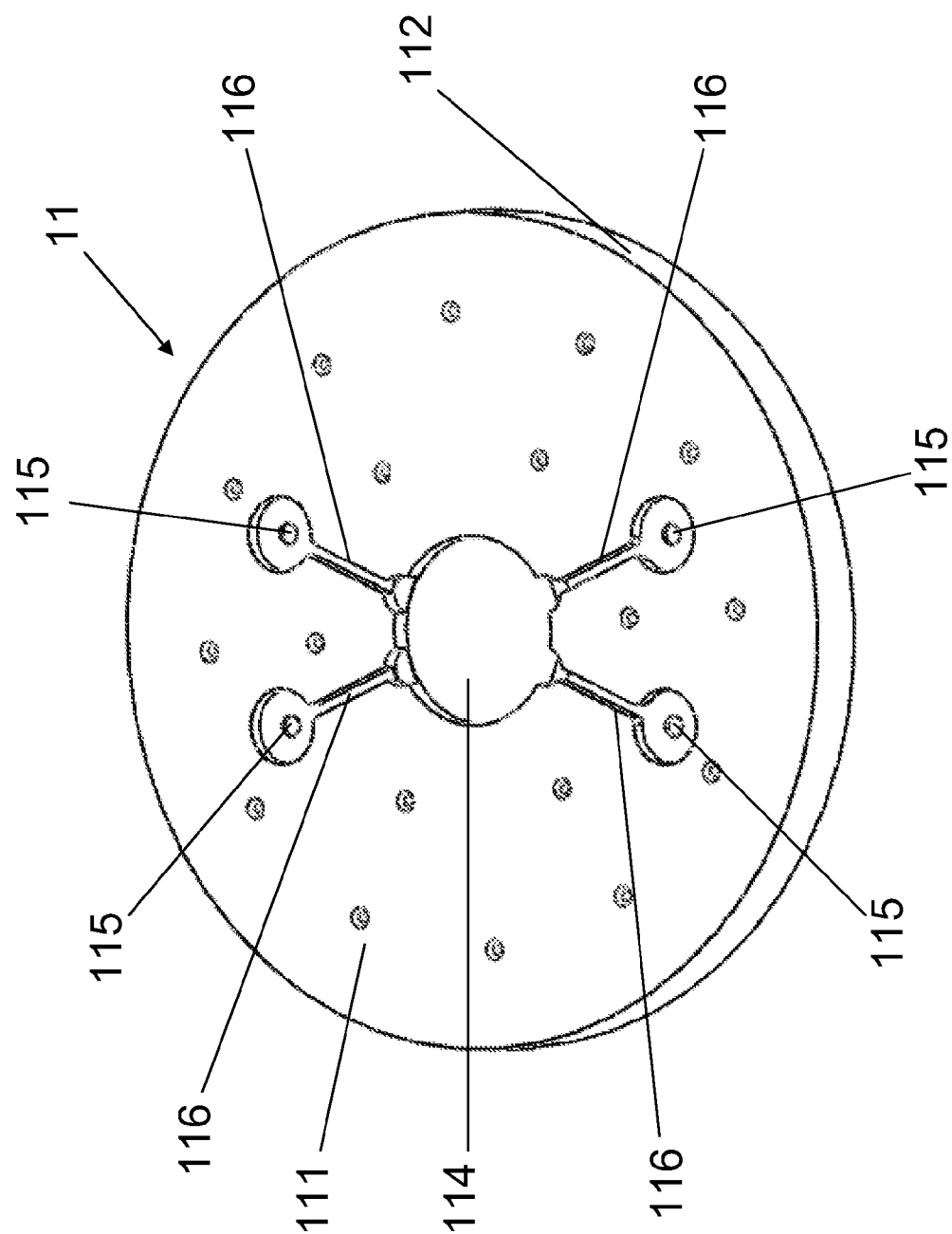
FIG. 3 is a top view of a supporting body of the vacuum chuck.
Figure 4:
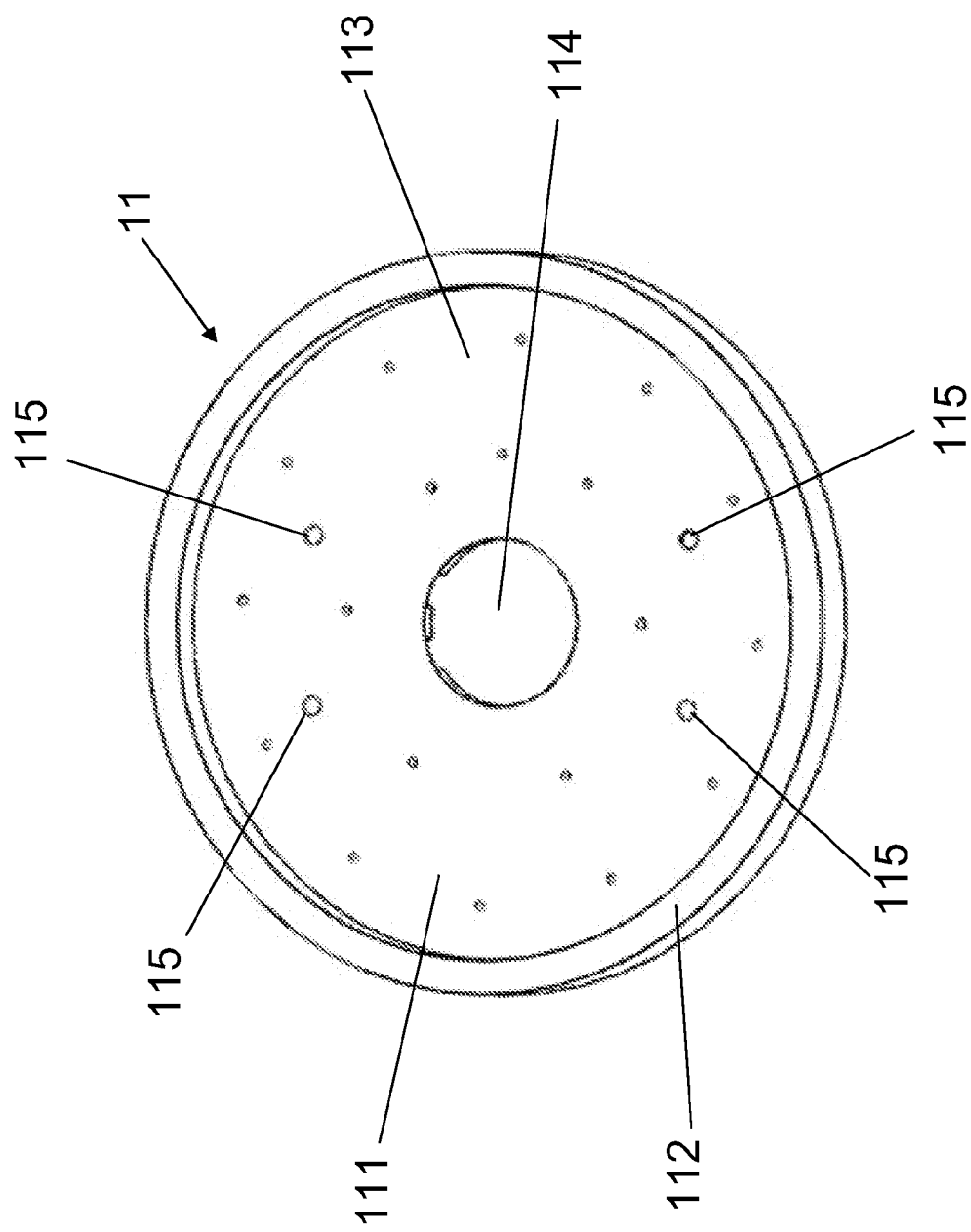
FIG. 4 is a bottom view of the supporting body of the vacuum chuck.
Figure 5:
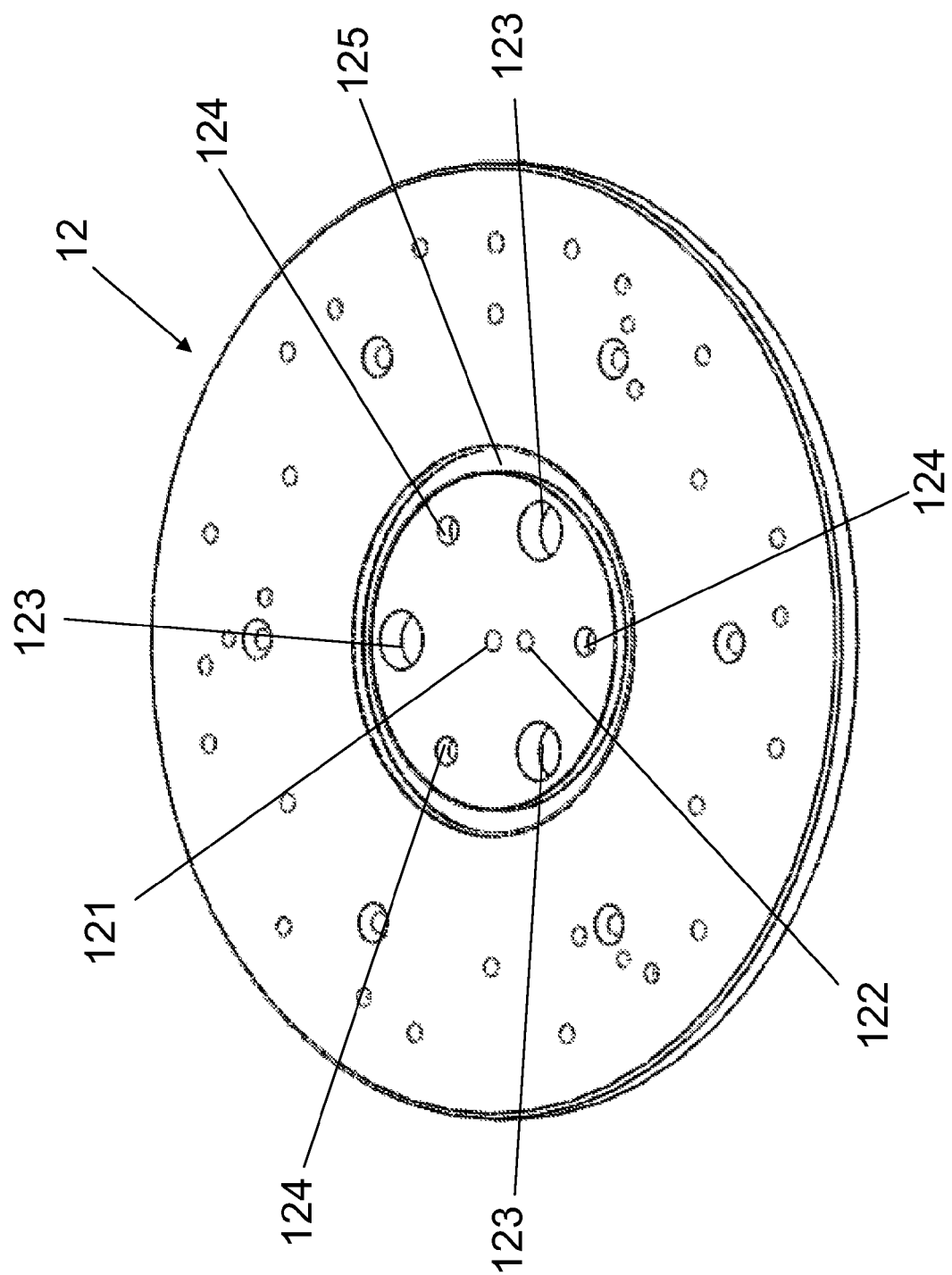
FIG. 5 is a top view of a middle plate of the vacuum chuck.
Figure 6:
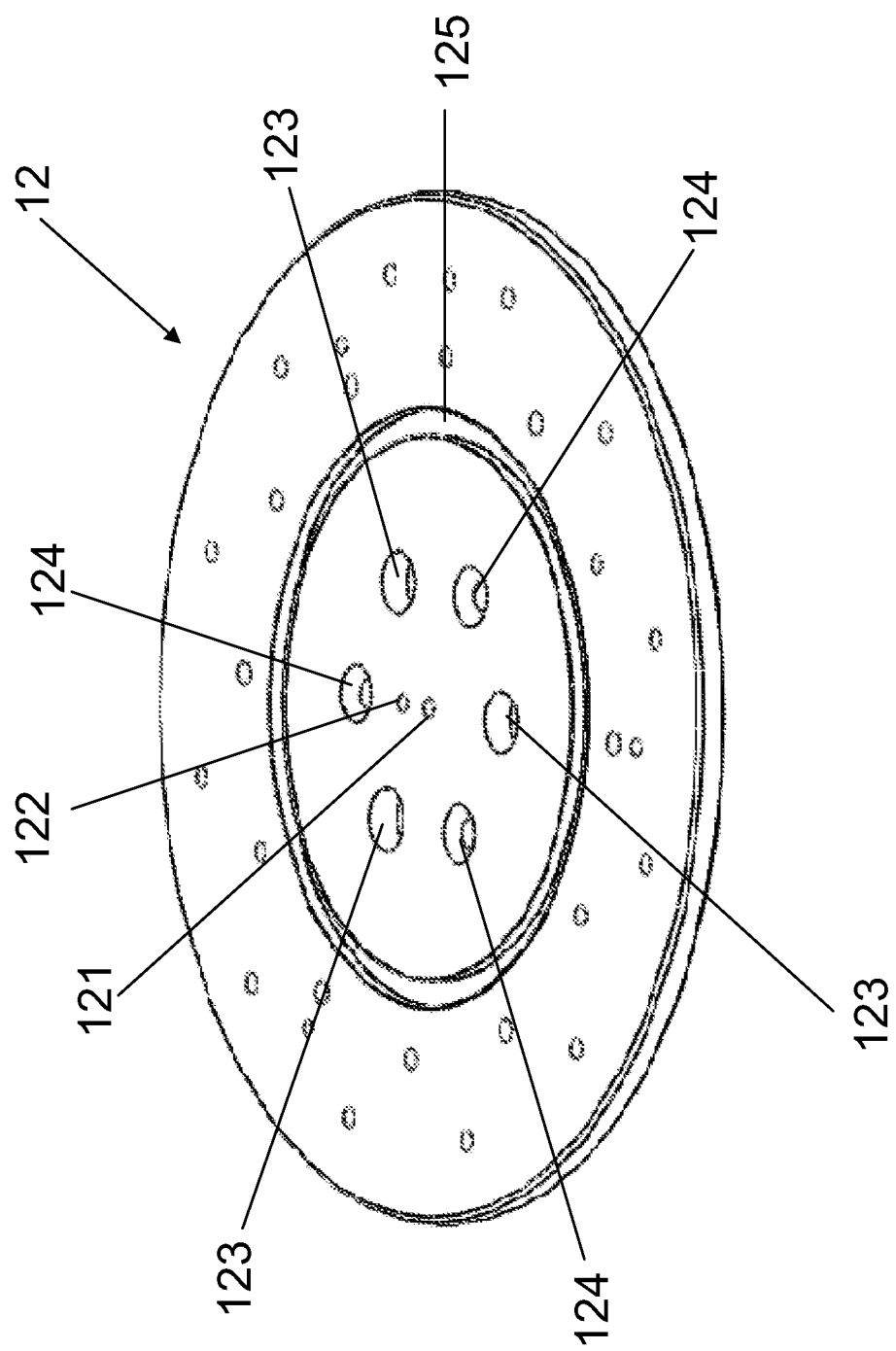
FIG. 6 is a bottom view of the middle plate of the vacuum chuck.
Figure 7:
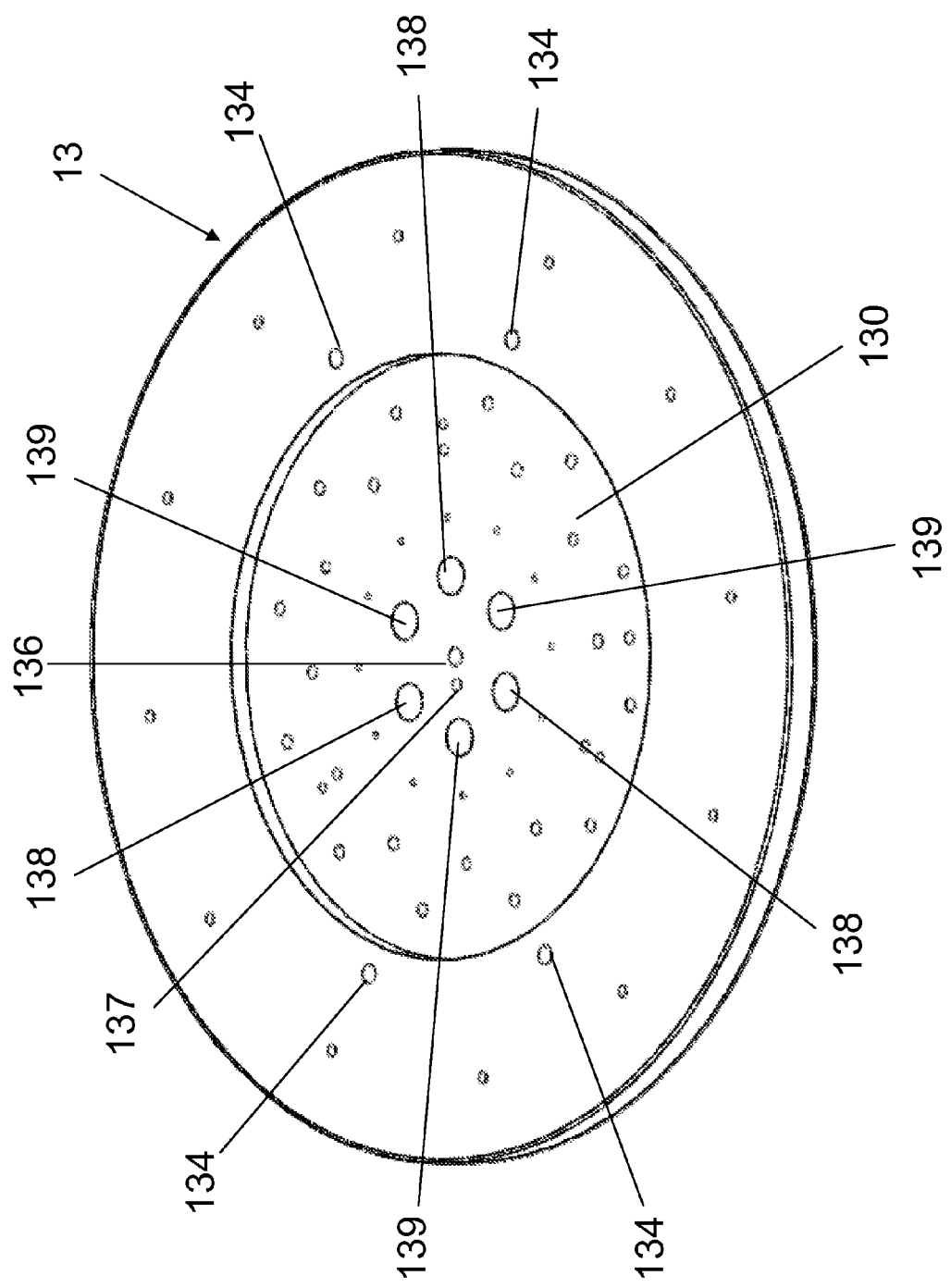
FIG. 7 is a top view of a bottom pedestal of the vacuum chuck.
Figure 8:
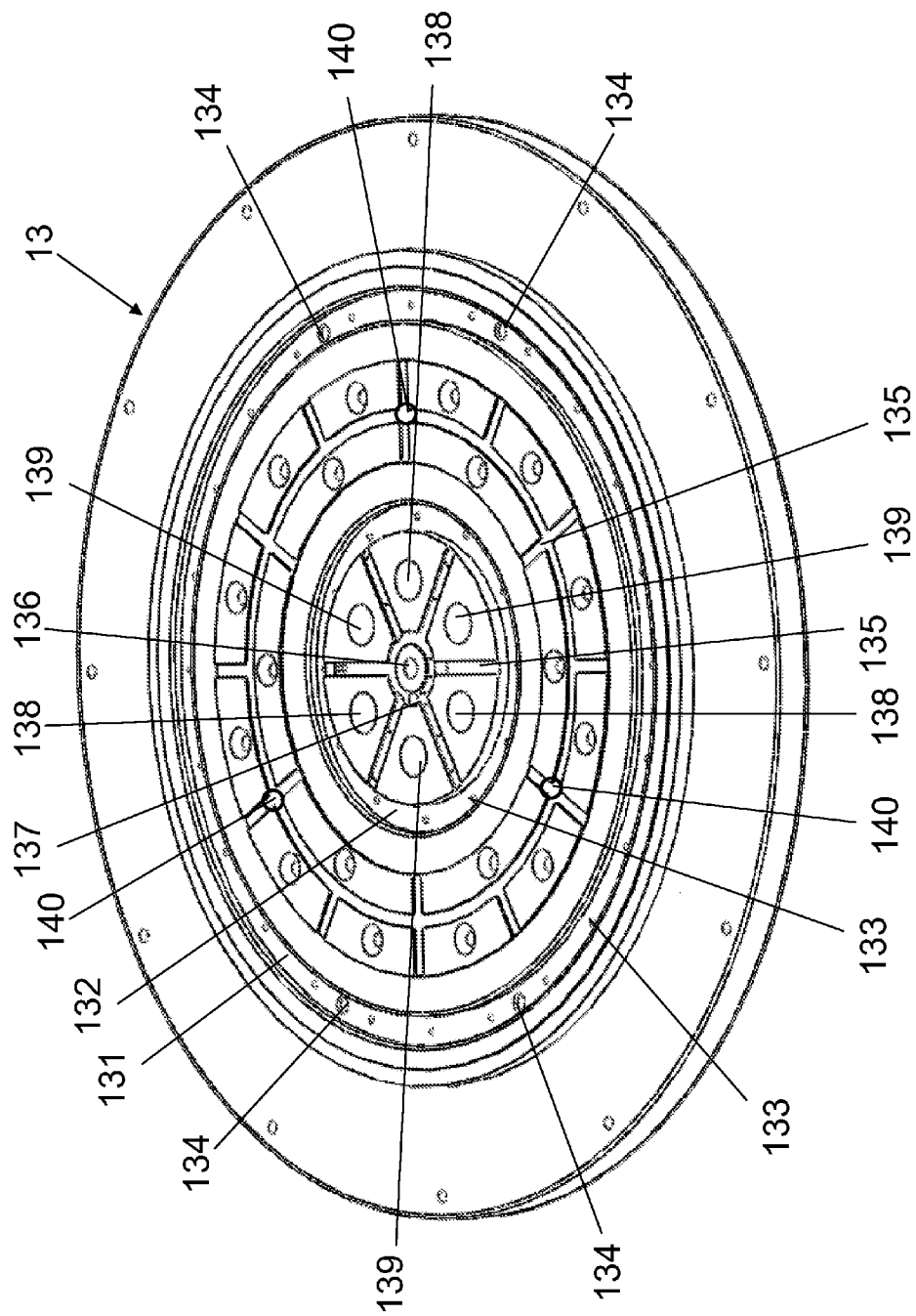
FIG. 8 is a bottom view of the bottom pedestal of the vacuum chuck.

Referring to FIGS. 1 to 11, a vacuum chuck 100 of the present invention will be described in detail with reference to the accompanying drawings. The vacuum chuck 100 is substantially circular. The vacuum chuck 100 includes a supporting assembly 10 and a chuck connector 20 coupled with each other. The supporting assembly 10 includes a supporting body 11, a bottom pedestal 13 and a middle plate 12 disposed between the supporting body 11 and the bottom pedestal 13. The supporting body 11, the middle plate 12 and the bottom pedestal 13 are fastened together through screws in the preferred embodiment. Without doubt, there are other ways to fasten the supporting body 11, the middle plate 12 and the bottom pedestal 13 together.

The supporting body 11 is in disk-shape and has a body portion 111 and a sidewall 112 protruding downwardly from the edge of the body portion 111. The body portion 111 and the sidewall 112 define a receiving portion 113 to receive the middle plate 12 and the bottom pedestal 13. The center of the body portion 111 defines a circular mating hole 114 wherein the chuck connector 20 is fixed. The body portion 111 defines four locating holes 115 passing therethrough. A top surface of the body portion 111 defines four holding trenches 116. One end of each holding trench 116 communicates with the corresponding locating hole 115, and the other end of each holding trench 116 communicates with the mating hole 114. The four locating holes 115 and the four holding trenches 116 are distributed on the body portion 111 symmetrically.

The middle plate 12 is a circular plate and has a first aligning hole 121 at the center thereof. A first vacuum passageway 122 is defined on the middle plate 12 and adjoining the first aligning hole 121. The middle plate 12 has first spindle holes 123 and first fixing holes 124. Preferably, there are three first spindle holes 123 and three first fixing holes 124, and the first spindle holes 123 and the first fixing holes 124 are distributed alternately and around the first aligning hole 121 and the first vacuum passageway 122. A top surface and a bottom surface of the middle plate 12 respectively define a circular recess 125 encircling the first aligning hole 121, the first vacuum passageway 122, the first spindle holes 123 and the first fixing holes 124. Two seal members 30 are fixed in the recesses 125 respectively for sealing the juncture place between the middle plate 12 and the chuck connector 20, and the juncture place between the middle plate 12 and the bottom pedestal 13, avoiding the air entering into the vacuum chuck 100.

The bottom pedestal 13 is in circular-shape and has a top surface and a bottom surface holding a wafer which needs to be processed. The top surface of the bottom pedestal 13 defines a circular hollow portion 130 at the center thereof for receiving the middle plate 12 therein. The bottom surface of the bottom pedestal 13 defines a first receiving groove 131 and a second receiving groove 132. The two receiving grooves 131, 132 are circular and concentric. The diameter of the first receiving groove 131 is greater than the diameter of the second receiving groove 132, which means the first receiving groove 131 is located near the edge of the bottom surface of the bottom pedestal 13 and the second receiving groove 132 is located near the center of the bottom surface of the bottom pedestal 13. Both the first receiving groove 131 and the second receiving groove 132 define a plurality of screw holes 133. The first receiving groove 131 defines four first vacuum apertures 134 distributed symmetrically and passing through the bottom pedestal 13. The bottom surface between the first receiving groove 131 and the second receiving groove 132 defines a plurality of interconnected air slots 135. Three pressure releasing holes 140 are symmetrically defined in the air slots 135 for releasing the vacuum drawing force between the first receiving groove 131 and the second receiving groove 132 when the wafer is taken away from the vacuum chuck 100. The center of the bottom pedestal 13 has a second aligning hole 136. A second vacuum passageway 137 is defined and passes through the bottom pedestal 13 and adjoining the second aligning hole 136. Three second spindle holes 138 and three second fixing holes 139 pass through the bottom pedestal 13. The second spindle holes 138 and the second fixing holes 139 are distributed alternately and around the second aligning hole 136 and the second vacuum passageway 137. The second aligning hole 136, the second vacuum passageway 137, the second spindle holes 138 and the second fixing holes 139 are surrounded by the second receiving groove 132. The bottom surface of the bottom pedestal 13 surrounded by the second receiving groove 132 defines a plurality of the air slots 135 communicating with the second vacuum passageway 137.

Figure 9:
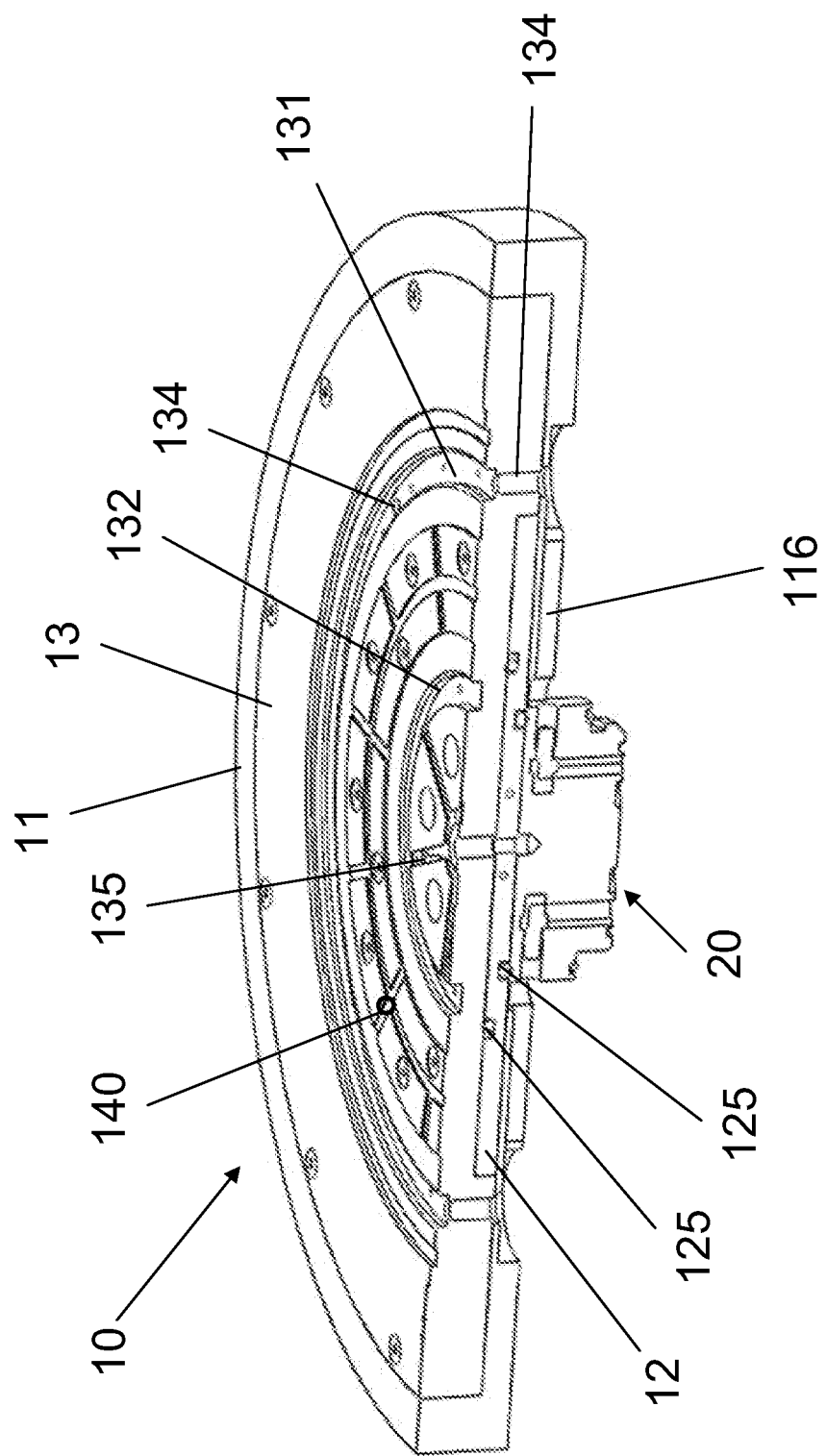
FIG. 9 is a cross-sectional view of a supporting assembly assembling with a chuck connector of the vacuum chuck.
Figure 10:
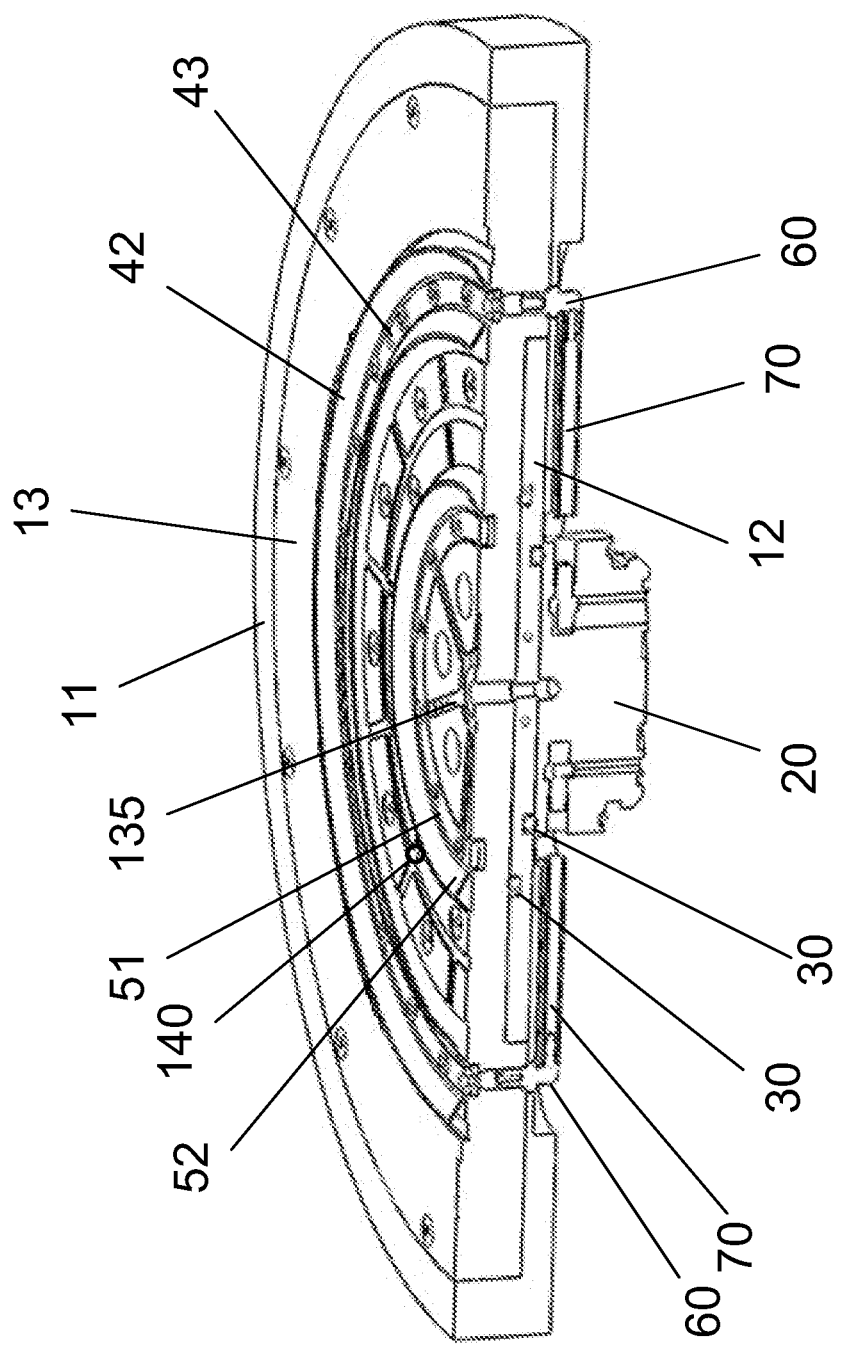
FIG. 10 is a cross-sectional view of the vacuum chuck.
Figure 11:
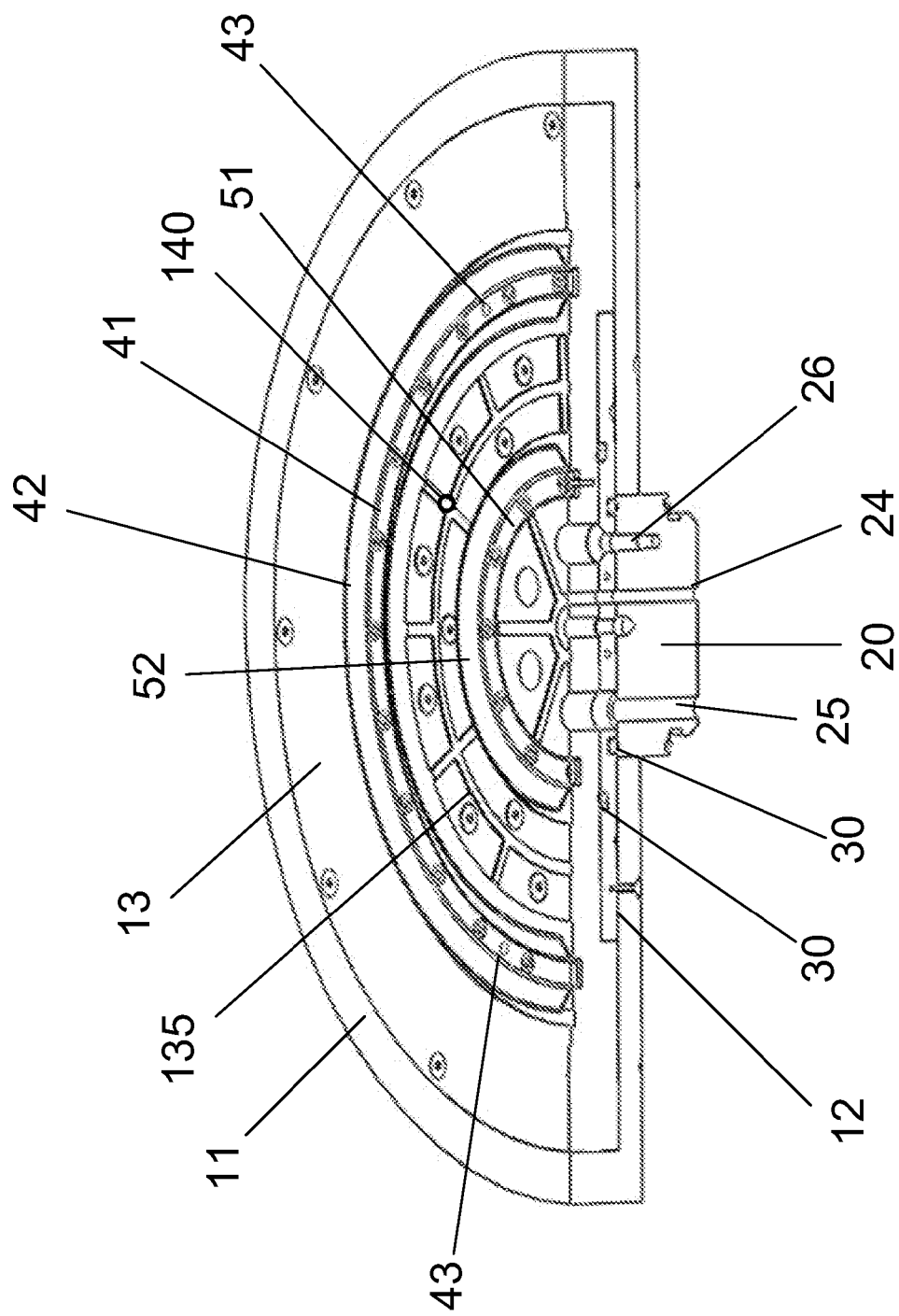
FIG. 11 is another cross-sectional view of the vacuum chuck.
Figure 12:
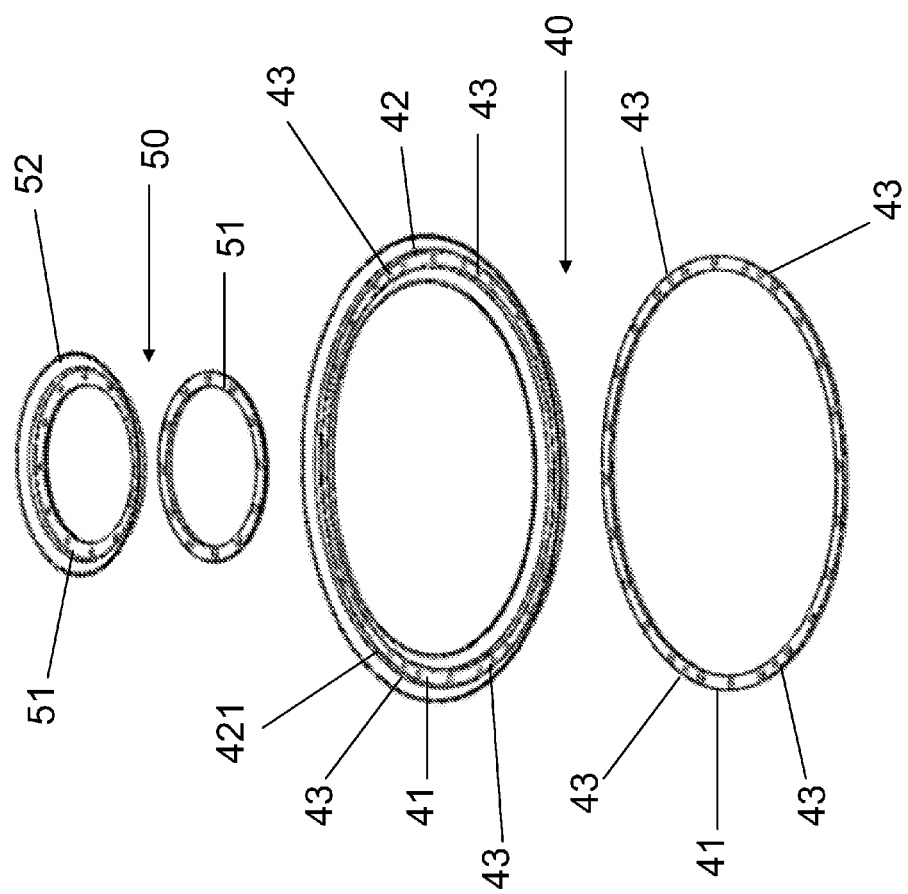
FIG. 12 is an exploded view of a first seal unit and a second seal unit of the vacuum chuck.

Please refer to FIG. 12 as well as FIGS. 9 to 11. A first seal unit 40 and a second seal unit 50 of the vacuum chuck 100 is illustrated. The first seal unit 40 includes a pair of first metal rings 41 and a first seal ring 42. The middle of the first seal ring 42 bulges to form a vacuum trough 421, and one of the first metal rings 41 is disposed in the vacuum trough 421. The pair of first metal rings 41 and the first seal ring 42 are fixed together through screws, and the first seal ring 42 is disposed between the pair of first metal rings 41. The first seal unit 40 is assembled in the first receiving groove 131 of the bottom pedestal 13 by inserting screws in the screw holes 133. Either of the first metal rings 41 and the first seal ring 42 have four second vacuum apertures 43 corresponding to the four first vacuum apertures 134 of the bottom pedestal 13. The second seal unit 50 includes a pair of second metal rings 51 and a second seal ring 52. The pair of second metal rings 51 are located at both sides of the inner edge of the second seal ring 52. The pair of second metal rings 51 and the inner edge of the second seal ring 52 are fixed together through the screws, and the inner edge of the second seal ring 52 is disposed between the pair of second metal rings 51. The second seal unit 50 is assembled in the second receiving groove 132 of the bottom pedestal 13 by inserting the screws in the screw holes 133. According to the requirement of different process operations, the first seal ring 42 and the second seal ring 52 can be made of any suitable material, such as rubber.

Figure 13:
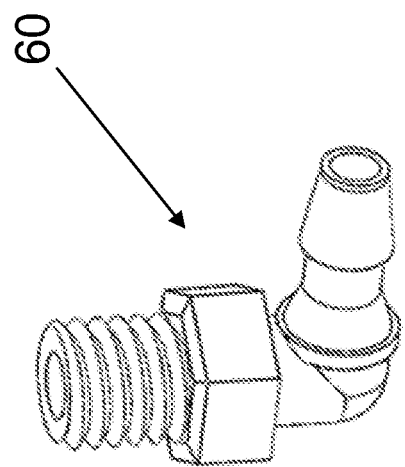
FIG. 13 is a perspective view of a connecting head of the vacuum chuck.

With reference to FIG. 13 as well as FIGS. 9 to 10, a connecting head 60 of the vacuum chuck 100 is illustrated. The connecting head 60 is hollow and substantially L-shaped. One end of the connecting head 60 has screw threads and is located in the corresponding first vacuum aperture 134 of the bottom pedestal 13. The other end of the connecting head 60 is substantially cone-shaped and is disposed in the corresponding locating hole 115 of the supporting body 11 to be inserted into a vacuum hose 70 which is received in the holding trench 116 of the supporting body 11. There are four connecting heads 60 and four vacuum hoses 70 to mate with the four first vacuum apertures 134 of the bottom pedestal 13, and the four locating holes 115 and the four holding trenches 116 of the supporting body 11 respectively.

Figure 14:
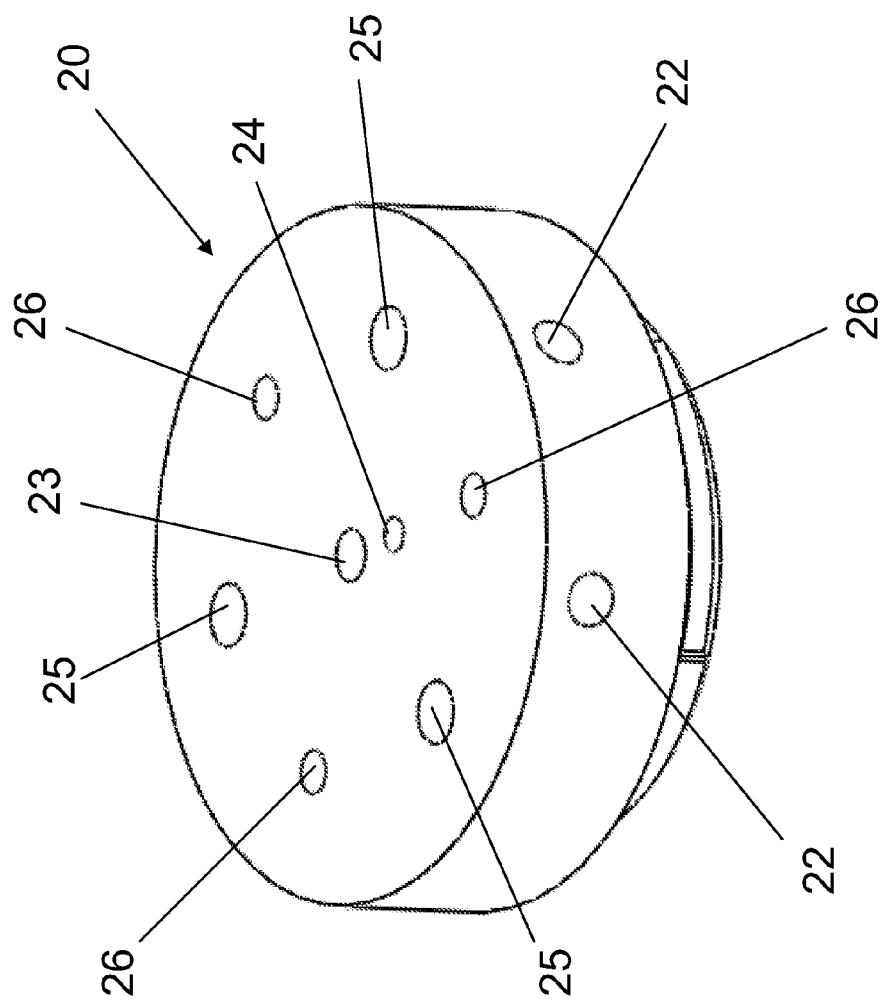
FIG. 14 is a perspective view of the chuck connector of the vacuum chuck.
Figure 15:
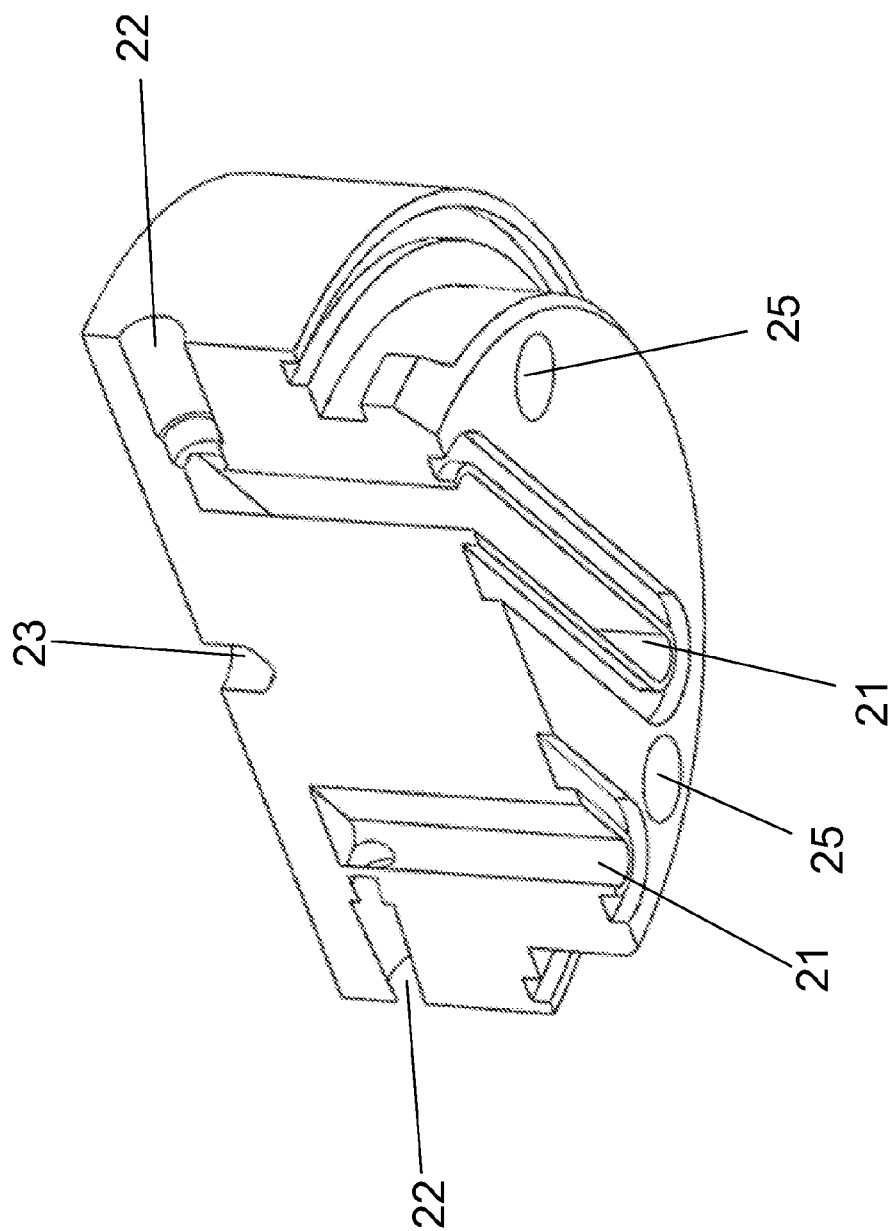
FIG. 15 is a cross-sectional view of the chuck connector.

Please refer to FIGS. 14 to 15 as well as FIGS. 1, 9, 10, 11. The chuck connector 20 defines two parallel elongated vacuum ports 21 on a top surface thereof. A sidewall of the chuck connector 20 defines four vacuum orifices 22. The four vacuum orifices 22 communicate with the two vacuum ports 21 respectively. A bottom surface of the chuck connector 20 defines a third aligning hole 23 at the center thereof. A third vacuum passageway 24 is defined and adjoining the third aligning hole 23 and passes through the chuck connector 20. Three third spindle holes 25 and three third fixing holes 26 are defined on the bottom surface of the chuck connector 20. The third spindle holes 25 and the third fixing holes 26 are distributed alternately and around the third aligning hole 23 and the third vacuum passageway 24. Two elongated seal elements 80 are provided and installed around the vacuum ports 21 for seal function when the chuck connector 20 is coupled with a vacuum source (not shown). The chuck connector 20 is fixed in the mating hole 114 of the supporting body 11 and is fastened with the middle plate 12 and the bottom pedestal 13 through inserting the screws in the first, second and third fixing holes 124, 139, 26. Three spindles (not shown) are installed in the first, second and third spindle holes 123, 138, 25. An aligning tool is located in the first, second and third aligning hole 121, 136, 23 for aligning the wafer on the vacuum chuck 100.

The vacuum chuck 100 in using, the bottom surface of the bottom pedestal 13 contacts with a wafer. More specifically, the first seal ring 42 contacts with the outer edge part of the wafer and the air in the vacuum trough 421 is evacuated from the vacuum apertures 43, 134, the connecting heads 60, the vacuum hoses 70, the vacuum orifices 22 and the vacuum ports 21 successively. The second seal ring 52 contacts with the middle part of the wafer and the air enclosed by the second seal ring 52 and the wafer is evacuated from the air slots 135 and the vacuum passageways 137, 122, 24. Then the wafer is held and positioned on the vacuum chuck 100 stably and securely.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. A vacuum chuck for holding and positioning wafers, comprising:
   a supporting assembly having a receiving groove and at least one first vacuum aperture defined in the receiving groove,
   a seal unit including a seal ring bulging to form a vacuum trough, the seal ring fixed in the receiving groove of the supporting assembly and having at least one second vacuum aperture communicating with the first vacuum aperture, the seal unit further comprising a pair of fixing rings, either of the fixing rings has at least one vacuum aperture corresponding to the second vacuum aperture of the seal ring, one of the fixing rings is disposed in the vacuum trough, the pair of fixing rings and the seal ring are fixed together, which is further fixed in the receiving groove of the supporting assembly, the seal ring is disposed between the pair of fixing rings,
   a chuck connector fastened with the supporting assembly and having at least one vacuum port and at least one vacuum orifice communicating with the vacuum port, and
   at least one vacuum hose connecting the first vacuum aperture, the second vacuum aperture with the vacuum orifice and the vacuum port of the chuck connector for evacuating the air in the vacuum trough to hold and position a wafer on the seal ring and the supporting assembly.

2. The vacuum chuck as claimed in claim 1, wherein the supporting assembly includes a supporting body and a bottom pedestal, the supporting body has a body portion and a sidewall protruding from the edge of the body portion, the body portion and the sidewall define a receiving portion to receive the bottom pedestal, the body portion defines a mating hole wherein the chuck connector is fixed and at least one locating hole, a top surface of the body portion defines at least one holding trench, one end of the holding trench communicates with the locating hole, and the other end of the holding trench communicates with the mating hole, the receiving groove and the first vacuum aperture are defined on the bottom pedestal, the first vacuum aperture communicates with the locating hole, the vacuum hose is located in the holding trench.

3. The vacuum chuck as claimed in claim 2, further comprising a hollow connecting head, one end of the connecting head located in the first vacuum aperture of the bottom pedestal, and the other end of the connecting head disposed in the locating hole or the supporting body to be inserted into the vacuum hose.

4. The vacuum chuck as claimed in claim 3, wherein the connecting head is substantially L-shaped, one end of the connecting head located in the first vacuum aperture of the bottom pedestal has screw threads, and the other end of the connecting head inserted into the vacuum hose is substantially cone-shaped.

5. The vacuum chuck as claimed in claim 2, wherein the bottom pedestal defines a plurality of interconnected air slots encircled by the receiving groove.

6. The vacuum chuck as claimed in claim 5, wherein at least one pressure releasing hole is defined in the air slots.

7. A vacuum chuck for holding and positioning wafers, comprising:
   a supporting assembly having a first receiving groove and a second receiving groove, at least one first vacuum aperture defined in the first receiving groove, the supporting assembly having a vacuum passageway encircled by the second receiving groove,
   a first seal unit and a second seal unit, the first seal unit including a first seal ring bulging to form a vacuum trough, the first seal ring fixed in the first receiving groove of the supporting assembly and having at least one second vacuum aperture communicating with the first vacuum aperture, the second seal unit including a second seal ring fixed in the second receiving groove,
   a chuck connector fastened with the supporting assembly and having at least one vacuum port and at least one vacuum orifice communicating with the vacuum port, the chuck connector having a vacuum passageway communicating with the vacuum passageway of the supporting assembly for evacuating the air enclosed by the second seal ring and the wafer, and
   at least one vacuum hose connecting the first vacuum aperture, the second vacuum aperture with the vacuum orifice and the vacuum port of the chuck connector for evacuating the air of the vacuum trough to hold and position the wafer on the seal rings and the supporting assembly.

8. The vacuum chuck as claimed in claim 7, wherein the first seal unit further comprises a pair of first fixing rings, either of the first fixing ring has at least one vacuum aperture corresponding to the second vacuum aperture of the first seal ring, one of the first fixing rings is disposed in the vacuum trough, the pair of first fixing rings and the first seal ring are fixed together, which is further fixed in the first receiving groove of the supporting assembly, the first seal ring is disposed between the pair of first fixing rings.

9. The vacuum chuck as claimed in claim 7, wherein the second seal unit further comprises a pair of second fixing rings located at both sides of the inner edge of the second seal ring, the pair of second fixing rings and the inner edge of the second seal ring are fixed together, which is further fixed in the second receiving groove of the supporting assembly, and the inner edge of the second seal ring is disposed between the pair of second fixing rings.

10. The vacuum chuck as claimed in claim 7, wherein the supporting assembly includes a supporting body and a bottom pedestal, the supporting body has a body portion and a sidewall protruding from the edge of the body portion, the body portion and the sidewall define a receiving portion to receive the bottom pedestal, the body portion defines a mating hole wherein the chuck connector is fixed and at least one locating hole, a top surface of the body portion defines at least one holding trench, one end of the holding trench communicates with the locating hole, and the other end of the holding trench communicates with the mating hole, the first receiving groove and the second receiving groove are defined on the bottom pedestal, the first vacuum aperture communicates with the locating hole, the vacuum hose is located in the holding trench.

11. The vacuum chuck as claimed in claim 10, further comprising a hollow connecting head, one end of the connecting head located in the first vacuum aperture, and the other end of the connecting head disposed in the locating hole of the supporting body to be inserted into the vacuum hose.

12. The vacuum chuck as claimed in claim 11, wherein the connecting head is substantially L-shaped, one end of the connecting head located in the first vacuum aperture has screw threads, and the other end of the connecting head inserted into the vacuum hose is substantially cone-shaped.

13. The vacuum chuck as claimed in claim 10, wherein the bottom pedestal between the first receiving groove and the second receiving groove has a plurality of interconnected air slots.

14. The vacuum chuck as claimed in claim 13, wherein at least one pressure releasing hole is defined in the air slots.

15. The vacuum chuck as claimed in claim 10, wherein the bottom pedestal surrounded by the second receiving groove has a plurality of the air slots communicating with the vacuum passageway of the supporting assembly.

16. The vacuum chuck as claimed in claim 10, wherein the supporting assembly further includes a middle plate disposed between the supporting body and the bottom pedestal and fixed with the chuck connector, the middle plate defines a first vacuum passageway, the bottom pedestal has a second vacuum passageway, the first vacuum passageway and the second vacuum passageway communicate with the vacuum passageway of the chuck connector.

17. The vacuum chuck as claimed in claim 16, wherein the middle plate defines a recess on a top surface and a bottom surface thereof, the two recesses respectively encircles the first vacuum passageway, two seal members are fixed in the recesses respectively for sealing the juncture place between the middle plate and the chuck connector, and the juncture place between the middle plate and the bottom pedestal.

18. The vacuum chuck as claimed in claim 17, wherein the middle plate, the bottom pedestal and the chuck connector respectively have an aligning hole at the center thereof, the aligning hole of the middle plate is encircled by the recesses, the aligning hole of the bottom pedestal is encircled by the second receiving groove, the vacuum passageways of the middle plate, the bottom pedestal and the chuck connector are respectively adjoining the aligning holes.

19. The vacuum chuck as claimed in claim 18, wherein the middle plate, the bottom pedestal and the chuck connector respectively have several fixing holes or several spindle holes distributed around the aligning holes and the vacuum passageways.

* * * * *